United States Patent
Chiang et al.

(10) Patent No.: US 6,949,831 B2
(45) Date of Patent: Sep. 27, 2005

(54) IN-PLANE ON-CHIP DECOUPLING CAPACITORS AND METHOD FOR MAKING SAME

(75) Inventors: Chien Chiang, Fremont, CA (US); David B. Fraser, Danville, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/890,716

(22) Filed: Jul. 13, 2004

(65) Prior Publication Data

US 2004/0245606 A1 Dec. 9, 2004

Related U.S. Application Data

(62) Division of application No. 09/191,930, filed on Nov. 13, 1998, now Pat. No. 6,777,320.

(51) Int. Cl.[7] .............................................. H01L 23/48
(52) U.S. Cl. ..................................................... 257/760
(58) Field of Search ................................ 257/758, 760, 257/635, 759; 438/624

(56) References Cited

U.S. PATENT DOCUMENTS

| | | | |
|---|---|---|---|
| 4,153,988 A | * | 5/1979 | Doo ............................. 29/827 |
| 5,288,949 A | * | 2/1994 | Crafts ......................... 174/250 |
| 5,432,128 A | | 7/1995 | Tsu |
| 5,486,493 A | | 1/1996 | Jeng |
| 5,512,775 A | | 4/1996 | Cho |
| 5,646,440 A | * | 7/1997 | Hasegawa .................... 257/635 |
| 5,708,303 A | | 1/1998 | Jeng |
| 5,751,066 A | * | 5/1998 | Havemann .................. 257/759 |
| 6,040,628 A | | 3/2000 | Chiang et al. |
| 6,054,769 A | * | 4/2000 | Jeng ............................ 257/758 |
| 6,071,809 A | | 6/2000 | Zhao |
| 6,222,269 B1 | | 4/2001 | Usami |
| 6,225,207 B1 | * | 5/2001 | Parikh ......................... 438/622 |
| 6,239,019 B1 | | 5/2001 | Chiang et al. |
| 6,243,653 B1 | | 6/2001 | Findley |
| 6,246,112 B1 | * | 6/2001 | Ball et al. .................... 257/690 |
| 6,437,441 B1 | * | 8/2002 | Yamamoto .................. 257/758 |

FOREIGN PATENT DOCUMENTS

EP                0851471 A2        7/1998

* cited by examiner

Primary Examiner—Olik Chaudhuri
Assistant Examiner—Lex H. Malsawma
(74) Attorney, Agent, or Firm—Blakely, Sokoloff, Taylor & Zafman LLP

(57) ABSTRACT

An interconnect structure for microelectronic devices includes a plurality of patterned, spaced apart, substantially co-planar, conductive lines, a first portion of the plurality of conductive lines having a first Intralayer dielectric of a first dielectric constant therebetween, and a second portion of the plurality of conductive lines having a second intralayer dielectric of a second dielectric constant therebetween. By providing in-plane selectability of dielectric constant, in-plane decoupling capacitance, as between power supply nodes, can be increased, while in-plane parasitic capacitance between signal lines can be reduced.

25 Claims, 6 Drawing Sheets

IN-PLANE ON-CHIP DECOUPLING CAPACITORS AND METHOD FOR MAKING SAME

The present application is a divisional U.S. patent application Ser. No. 09/191,930 filed Nov. 13, 1998, now U.S. Pat. No. 6,777,320 entitled "IN-PLANE ON-CHIP DECOUPLING CAPACITORS AND METHOD FOR MAKING SAME", which is entirely incorporated herein by reference.

BACKGROUND OF THE INVENTION

Field of the Invention

The present invention relates generally to microelectronic structures and fabrication methods, and more particularly to in-plane decoupling capacitor structures and methods of making the same.

Background

Advances in semiconductor manufacturing technology have led to the development of integrated circuits having multiple levels, of interconnect. In such an integrated circuit, patterned conductive material on one interconnect level is electrically insulated from patterned conductive material on another interconnect level by films of material such as silicon dioxide. These patterned conductive materials are also referred to as interconnect lines. The spaced apart interconnect lines on each interconnect level are typically provided with insulating material therebetween The interconnect lines on each interconnect level are typically substantially co-planar. Connections between the conductive material at the various interconnect levels are made by forming openings in the insulating layers and providing an electrically conductive structure such that the patterned conductive material from different interconnect levels are brought into electrical contact with each other. These structures are often referred to as contacts or vias.

A consequence of having many interconnect lines separated by an insulating layer is the formation of undesired capacitors. The parasitic capacitance between patterned conductive material, or more simply, interconnects, separated by insulating material on microelectronic devices contributes to effects such as RC delay, power dissipation, and capacitively coupled signals, also known as cross-talk. In view of the adverse effects of parasitic capacitance on the performance of integrated circuits, it is desirable to reduce the capacitance between interconnect lines. One way to reduce the unwanted capacitance between the interconnects is to use an insulating material with a lower dielectric constant.

Unlike parasitic capacitance between interconnect lines, which adversely affects circuit performance, decoupling capacitance is used to make circuits more robust in the presence of power supply noise. Decoupling capacitors are typically formed between power supply nodes. In this way, the rail-to-rail voltage across a circuit is protected to some degree from noise-induced voltage excursions in the power rails. Decoupling capacitors are often formed external to an integrated circuit, or may even be incorporated into the packaging of an integrated circuit.

What is needed is a structure that provides on-chip relatively high valued decoupling capacitors between power supply nodes, while providing low capacitance between interconnect lines that are used to carry signals. What is further needed are methods of making such a structure.

SUMMARY OF THE INVENTION

Briefly, an Interconnect structure for microelectronic devices includes a plurality of patterned, spaced apart, substantially co-planar, conductive lines, a first portion of the plurality of conductive lines having a first intralayer dielectric of a first dielectric constant therebetween, and second portion of the plurality of conductive lines having a second intralayer dielectric of a second dielectric constant therebetween.

DETAILED DESCRIPTION

Terminology

Figure 1:
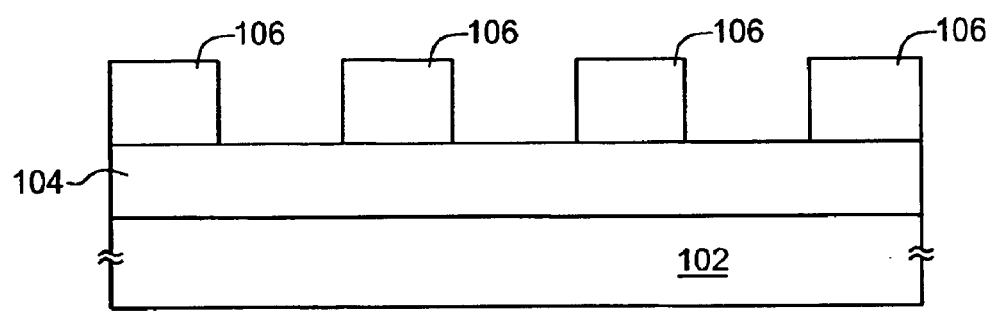
FIG. 1 is a schematic cross-section of a patterned mask layer over a high dielectric constant material, which is formed over an insulating layer.

The terms, chip, integrated circuit, monolithic device, semiconductor device, and microelectronic device, are often used interchangeably in this field. The present Invention is applicable to all the above as they are generally understood in the field.

The terms metal line, trace, wire, conductor, signal path and signaling medium are all related. The related terms listed above, are generally interchangeable, and appear in order from specific to general. In this field, metal lines are sometimes referred to as traces, wires, lines, interconnect or simply metal. Metal lines, such as aluminum (Al), copper (Cu) an alloy of Al and Cu, an alloy of Al, Cu and silicon (Si), an alloy of Cu and magnesium (Mg), or an alloy of Cu and niobium (Nb), are conductors that provide signal paths for coupling or interconnecting, electrical circuitry. Conductors other than metal are available in microelectronic devices. Materials such as doped polysilicon, doped single-crystal silicon (often referred to simply as diffusion, regardless of whether such doping is achieved by thermal diffusion or ion implantation), titanium (Ti), tantalum (Ta), tantalum nitride (TaN), tungsten (W), nickel (Ni), molybdenum (Mo), and refractory metal silicides are examples of other conductors.

The terms contact and via, both refer to structures for electrical connection of conductors from different interconnect levels. These terms are sometimes used in the art to describe both an opening in an insulator in which the structure will be completed, and the completed structure itself. For purposes of this disclosure contact and via refer to the completed structure.

The expression, low dielectric constant material, refers to materials having a lower dielectric constant than oxides of silicon. For example, organic polymers, nanofoams, silicon based insulators containing organic polymers, and fluorine containing oxides of silicon have lower dielectric constants than silicon dioxide.

The letter k, is often used to refer to dielectric constant. Similarly, the terms high-k, and low-k, are used in this field to refer to high dielectric constant and low dielectric constant respectively.

The term intralayer dielectric as used in this field is understood to refer to the dielectric material disposed between interconnect lines on a given interconnect level. That is, an intralayer dielectric is found between adjacent interconnect lines, rather than vertically above or below those interconnect lines.

The term vertical, as used herein, means substantially perpendicular to the surface of a substrate.

Overview

Interconnect lines on integrated circuits are generally used for the distribution of power and signals. Those skilled In the art will recognize that integrated circuit power supply nodes typically include large amounts of interconnect. These power supply interconnect lines are needed to distribute power throughout the integrated circuit.

Capacitance between interconnect lines in integrated circuits is wellknown to be a function of the distance, i.e., separation, between the lines, the dielectric constant of the material between the lines, and the area over which the lines face each other. In fact. for many simple modeling purposes, the parallel plate capacitor is used to model the capacitance between interconnect lines.

Conventionally, the interconnect lines on a given level of chip interconnect have the same dielectric material disposed in between them. This results from conventional manufacturing processes, and means that all these interconnect lines have a material with a given dielectric constant between them.

Reducing the capacitance between interconnect lines by increasing the distance between the lines tends to result in a larger, and thus more expensive, chip. Therefore, in order to reduce the undesired effects of parasitic capacitance between signal-carrying interconnect lines, manufacturers have increasingly sought to use low dielectric constant material between interconnect lines. Unfortunately, in conventional processes, reducing the dielectric constant of the material disposed between interconnect lines, not only reduces parasitic capacitance, it also reduces decoupling capacitance.

In some instances it is desirable to increase on chip capacitance between power supply nodes so as to increase the decoupling capacitance that in turn helps to provide noise immunity for the individual circuits on a chip. At the same time, it is generally desirable to reduce the capacitance between signal-carrying interconnect lines. As is known in this field, reducing the parasitic capacitance between signal carrying lines results in higher speed operation and lower power consumption.

Embodiments of the present invention provide integrated circuits having increased localized decoupling capacitance between power supply nodes, without unduly adding to the parasitic capacitance between signal nodes. More particularly, embodiments of the present invention provide, on a given interconnect level, high dielectric constant material as an Intralayer dielectric between power supply nodes and low dielectric constant material as an intralayer dielectric between signal nodes. In this way, in-plane decoupling between power supply nodes is improved, while maintaining the advantages of low parasitic capacitance between signal carrying interconnect lines.

Embodiments of the present invention may be particularly useful for integrated circuits that use copper as the primary material for interconnect lines.

Since copper has a lower resistivity than other conductive materials that have traditionally been used for interconnect lines, it is possible to achieve traditional values of sheet resistance while using thinner interconnect lines. Thinner interconnect lines are desirable for reducing parasitic capacitance between signal-carrying interconnect lines, but this is disadvantageous in that such an arrangement reduces the decoupling capacitance between adjacent power supply interconnect lines.

A first illustrative embodiment of the present invention that incorporates damascene processing, is described in conjunction with FIGS. 1–6, and a second illustrative embodiment of the present invention that incorporates a subtractive metal process, is described in conjunction with FIGS. 7–12. Two further illustrative embodiments of the present invention, both of which incorporate damascene processing, are described in conjunction with FIGS. 13–16, and FIGS. 17–21 respectively.

Referring now to FIGS. 1–6, a method, in accordance with the present invention, of forming interconnect on a microelectronic device wherein a first portion of the interconnect lines have a high dielectric constant material formed therebetween and a second portion of the Interconnect lines have a low dielectric constant material formed therebetween, is described.

FIG. 1 shows a cross-sectional view of a portion of a wafer and more particularly shows an insulating substrate 102 over which a first dielectric layer 104 is formed. A masking material is then deposited onto the surface and patterned to form patterned masking layer 106. Masking materials and photolithography techniques for patterning masking materials are well-known in this field.

Figure 2:
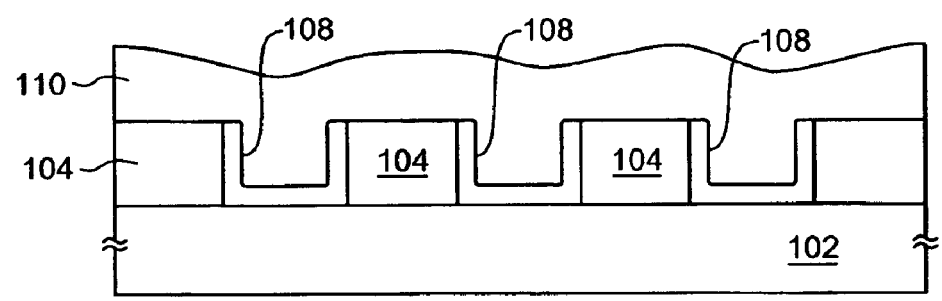
FIG. 2 is a schematic cross-section showing the high dielectric constant material of FIG. 1, after trenches have been etched, the trenches lined with a barrier layer, and a layer of conductive material formed thereover.

Subsequent to the formation of patterned masking layer 106, an etching operation is performed such that trenches are formed in first dielectric layer 104 as shown in FIG. 2. FIG. 2 also shows that an operation is performed to produce liners 108 which cover the inner surfaces of the trenches. In the illustrative embodiment, liners 108 are typically formed by depositing a thin layer of titanium nitride over the surface of the wafer, including the Inner surfaces of the trenches, and then removing that portion of the titanium nitride that is outside the inner surfaces of the trenches. The titanium nitride removal process is typically a chemical mechanical polishing operation. Subsequent to the formation of liners 108, a conductive material 110, such as, for example, copper, is deposited over the surface of the wafer.

Figure 3:
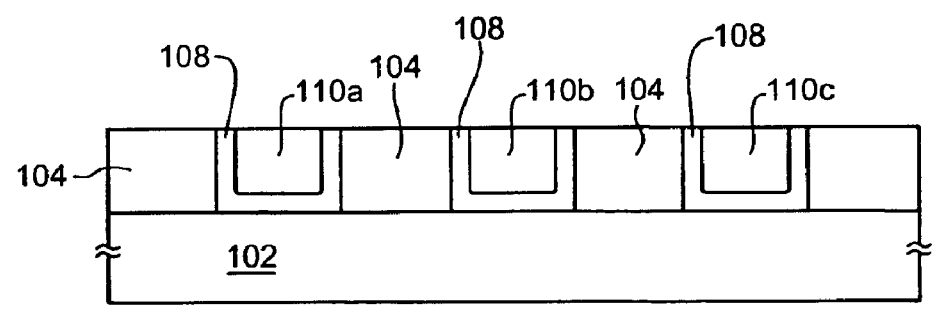
FIG. 3 is a schematic cross-section showing the structure of FIG. 2, after the conductive layer has been planarized.

FIG. 3 shows a cross-sectional view of the wafer shown in FIG. 2, after a planarization operation has been performed. Those skilled in the art and having the benefit of this disclosure will recognize that patterned interconnect lines 110a, 110b, 110c, result from planarizing conductive material 110 such that the conductive material remains in the trenches, which include liners 108, and is substantially removed from the surface of first dielectric layer 104. Typically, such planarization is achieved by chemical mechanical polishing.

Figure 4:
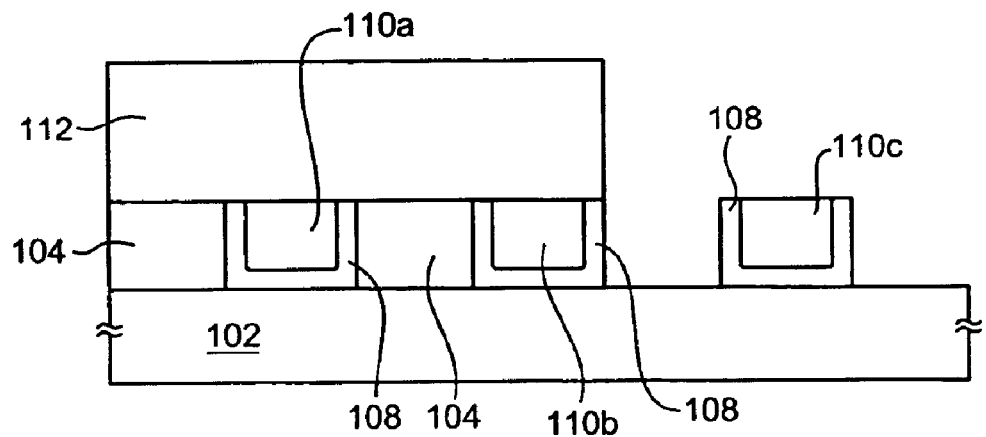
FIG. 4 is a schematic cross-section showing the structure of FIG. 3, after a masking layer has been patterned and a portion of the intralayer dielectric material has been removed.

Referring to FIG. 4, a masking layer 112 is patterned over the surface of the wafer such that a portion of the intralayer dielectric material 104 is exposed. After masking layer 112 is patterned, an etching operation is performed such that the exposed dielectric 104 is removed. After the etching operation, masking layer 112 is removed.

Figure 5:
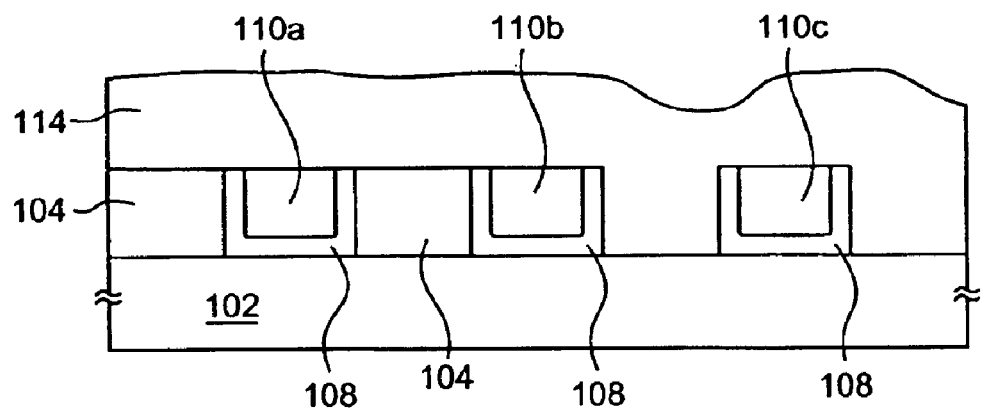
FIG. 5 is a schematic cross-section showing the structure of FIG. 4, after the masking layer has been removed and a low dielectric constant material has been deposited thereon.

As can be seen in FIG. 5, a layer of a second dielectric material 114 is deposited onto the surface of the wafer. The dielectric constant of second dielectric material 114 is different from the dielectric constant of first dielectric material 104.

Figure 6:
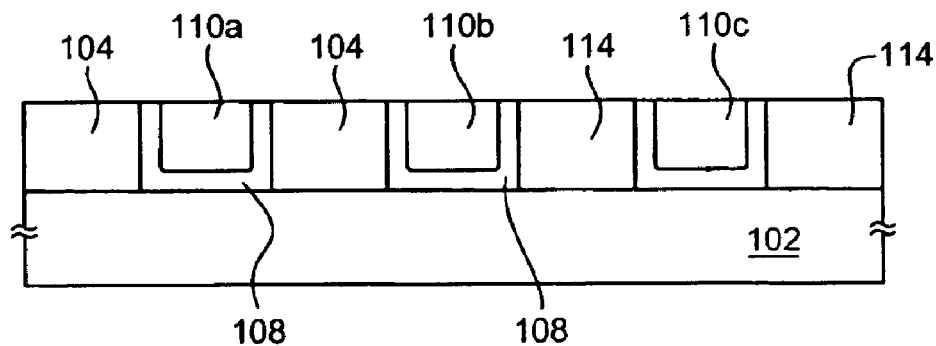
FIG. 6 is a schematic cross-section showing the structure, in accordance with the present invention, of FIG. 5 after further processing to planarize the low dielectric constant material.

FIG. 6 shows a cross-sectional view of the structure of FIG. 5, subsequent to a planarization operation. More particularly, FIG. 6 shows interconnect lines 110a and 110b with first dielectric material 104 therebetween and interconnect lines 110b and 110c with second dielectric material 114 therebetween. In the illustrative embodiment of the present invention shown in FIG. 6, the dielectric constant of dielectric material 104 Is greater than the dielectric constant of dielectric material 114. Consequently, the capacitance between Interconnect lines 110a and 110b, is greater than the capacitance between interconnect lines 110b and 110c, for a given area and spacing. Alternatively, it can be said that the unit capacitance between interconnect lines 110a and 110b, is greater than the unit capacitance between interconnect lines 110b and 110c.

Alternatively, the dielectric constant of dietectric material 104 may be less han the dielectric constant of dielectric material 114. In this alternative embodiment, the unit capacitance between interconnect lines 110a and 110b, is less than the unit capacitance betweeninterconnect lines 110b and 110c.

A further alternative method of forming interconnect on a microelectronic device wherein a first portion of the interconnect lines have a high dielectric constant material formed therebetween and a second portion of the interconnect lines have a low dielectric constant material formed therebetween, in accordance with the present invention, is described below in conjunction with FIGS. 7–12.

Figure 7:
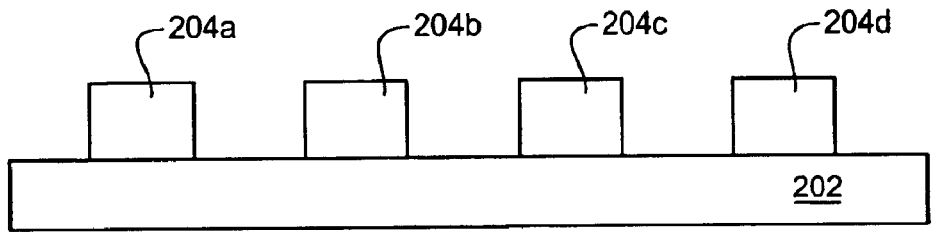
FIG. 7 is a schematic cross-secton showing a plurality of patterned interconnect lines formed o an insulating substrate.

FIG. 7 shows a cross-sectional view of a portion of a wafer and more particularly shows an insulating substrate 202 over which interconnect lines 204a, 204b, 204c, and 204d are formed. Interconnect lines 204a, 204b, 204c, and 204d are made of conductive material such as, for example, aluminum, aluminum alloys, or stacks of various metals, such as, for example aluminum and titanium. The present invention is not limited to any particular conductive material.

Figure 8:
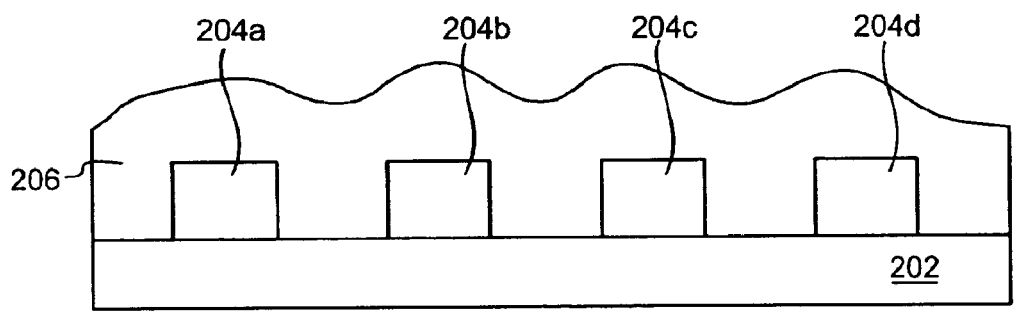
FIG. 8 is a schematic cross-section showing the structure of FIG. 7 with a first dielectric material disposed over its surface.

Referring to FIG. 8, a first dielectric material 206 is deposited onto the surface of the wafer.

Figure 9:
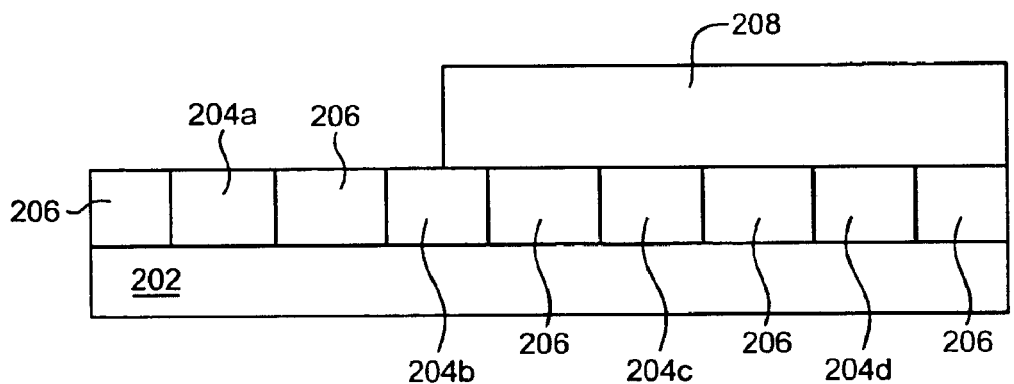
FIG. 9 is a schematic cross-section showing the structure of FIG. 8, after the first dielectric material has been planarized and a masking layer has been patterned over the surface.

Subsequently, first dielectric material 206 is planarized, as shown in FIG. 9. Planarization is typically, but not required to be, achieved by chemical mechanical polishing. A masking material is then deposited and patterned to form masking layer 208. Masking layer 208 is patterned in such a way that a first portion of intralayer dielectric material 206 is exposed, and a second portion of intralayer dielectric material 206 is covered.

Figure 10:
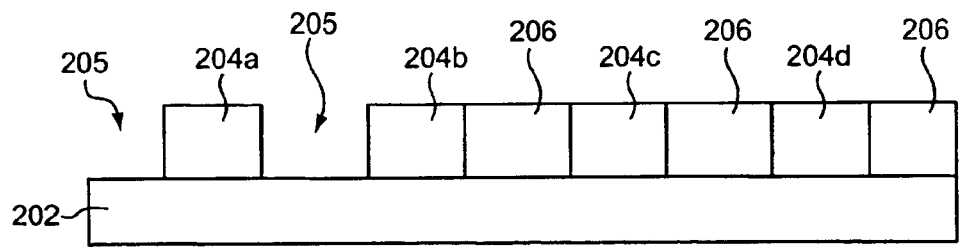
FIG. 10 is a schematic cross-section showing the structure of FIG. 9, after the first dielectric material not covered by the patterned masking layer has been removed, and the masking layer has been removed.

Referring to FIGS. 9 and 10, it can be seen that the exposed first portion of intralayer dielectric material 206 is removed by etching. Masking layer 208 is then removed. As shown in FIG. 10, the structure includes an insulating substrate 202 with conductive interconnect lines 204a, 204b, 204c, and 204d formed thereon, dielectric material 206 between interconnect lines 204b, 204c, and 204d, and gaps 205 surrounding Interconnect line 204a.

Figure 11:
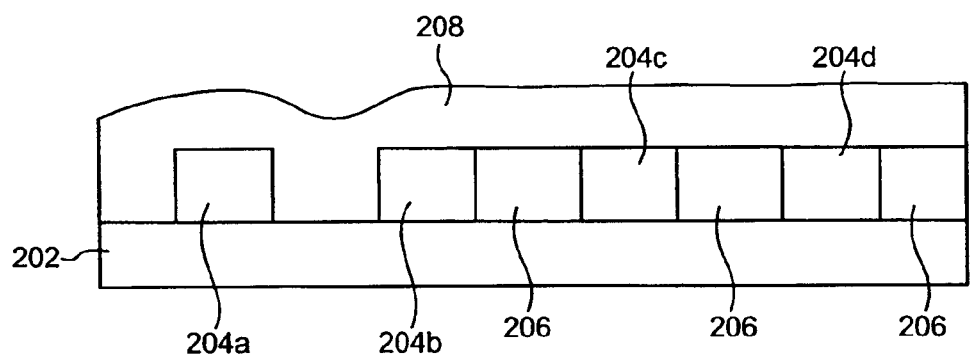
FIG. 11 is a schematic cross-section showing the structure of FIG. 10, after a second dielectric material is disposed over its surface.

As shown in FIG. 11, a layer of a second dielectric material 208 is deposited over the surface of the wafer. Second dielectric material 208 has a dielectric constant that is different from the dielectric constant of first dielectric material 206.

Figure 12:
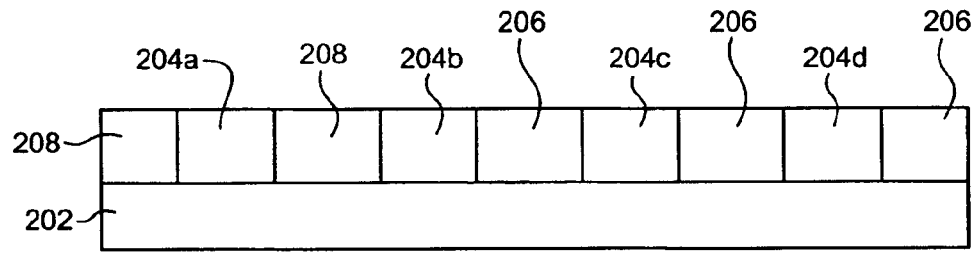
FIG. 12 is a schematic cross-section showing the structure, in accordance with the present invention, of FIG. 11 after further processing to planarize the second dielectric material.

A structure as shown in the cross-sectional view of FIG. 12, results from the planarization of the structure shown in FIG. 11. Typically, such a planarization is achieved by chemical mechanical polishing. As can be seen in FIG. 12, interconnect lines 204a and 204b have second dielectric material 208 therebetween and interconnect lines 204b and 204c as well as interconnect lines 204c and 204d have first dielectric material 206 therebetween. In the structure of the illustrative embodiment of the present invention shown in FIG. 12, the dielectric constant of dielectric material 208 is greater than the dielectric constant is of dielectric material 206. Consequently, the capacitance between interconnect lines 204a and 204b, is greater than the capacitance between interconnect lines 204b and 204c, for a given area and spacing. Altematively, it can be said that the unit capacitance between interconnect lines 204a and 204b, is greater than the unit capacitance between interconnect lines 204b and 204c.

Alternatively, the dielectric constant of dielectric material 208 may be less than the dielectric constant of dielectric material 206. In this alternative embodiment, the unit capacitance between interconnect lines 204a and 204b, is less than the unit capacitance between interconnect lines 204b and 204c.

In one typical embodiment of the present invention, a pair of interconnect lines that are coupled to a positive power supply node, and a ground node, respectively, are placed adjacent, but spaced apart from each other, on a particular interconnect level. Simultaneously, a pair of interconnect lines that are coupled to a first signal node, and a second signal node, respectively, are placed adjacent, but spaced apart from each other, on the same interconnect level with the power supply interconnect lines. In this embodiment of the present invention, a first dielectric material is disposed between the power supply interconnect lines and a second dielectric material is disposed between the signal interconnect lines. More particularly, the first dielectric material, i.e., the dielectric material between the power supply interconnect lines has a higher dielectric constant than the second dielectric material.

Referring to FIGS. 13–16, an alternative embodiment of the present invention is described. In this embodiment interconnect lines are formed by a damascene process in a first dielectric material. These interconnect lines and the immediately surrounding dielectric material are then masked, and the remainder of the dielectric material Is removed. A second dielectric material is then deposited and planarized. Subsequently. additional interconnect lines are formed by a damascene process in the area of the second dielectric material.

Figure 13:
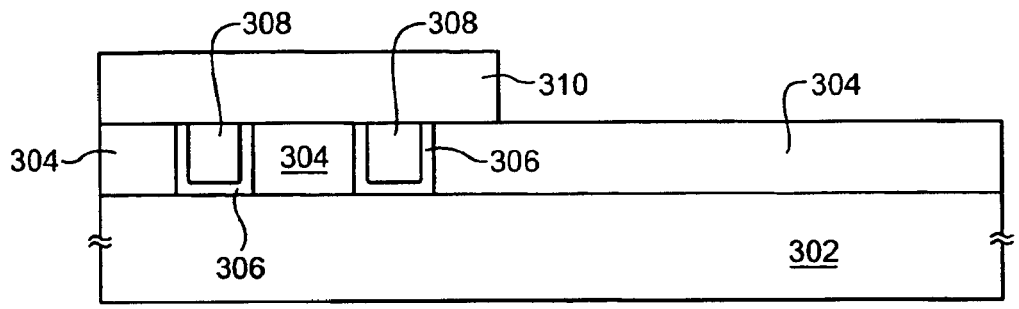
FIG. 13 is a schematic cross-section showing a patterned masking layer over a layer having patterned interconnect lines and a first intralayer dielectric of a first dielectric constant.

FIG. 13 is a schematic cross-section of a substrate 302 having patterned interconnect lines 308 and a first intralayer dielectric 304 of a first dielectric constant formed thereon. In this illustrative embodiment, first intralayer dielectric 304 comprises a high-k material. A patterned masking layer 310, which overlies interconnect lines 308 and a portion of first intralayer dielectric 304, is formed by conventional methods. In this illustrative embodiment, a liner 306 is disposed between interconnect lines 308 and first intralayer dielectric 304. Those skilled in the art will appreciate that a liner is sometimes used with interconnect lines so as to prevent undesirable interactions between the conductive material of the interconnect lines and the dielectric material that otherwise surrounds the interconnect lines.

Figure 14:
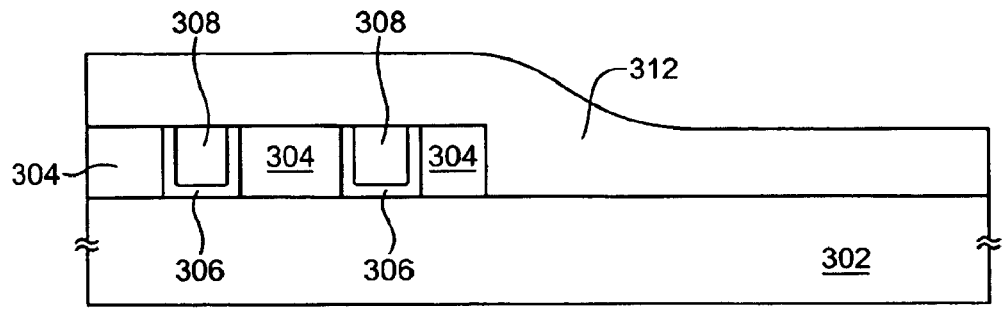
FIG. 14 is a schematic cross-section showing the structure of FIG. 13, after processing operations remove the unmasked portions of the first intralayer dielectric, remove the patterned masking layer, and dispose over its surface a second dielectric material of a second dielectric constant.

FIG. 14 is a schematic cross-section showing the structure of FIG. 13, after processing operations remove the unmasked portions of first intralayer dielectric 304, remove patterned masking layer 310, and dispose over its surface a second intralayer dielectric 312 of a second dielectric constant. In the illustrative embodiment second intralayer dielectric 312 comprises a low-k material.

Figure 15:
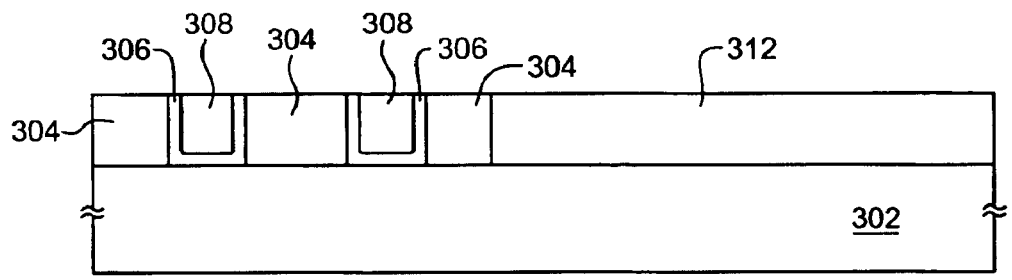
FIG. 15 is a schematic cross-section showing the structure of FIG. 14, after the second dielectric material is planarized.

Referring to FIG. 15, it can be seen that a planarization operation has been performed on second intralayer dielectric 312 such that a substantially planar surface is achieved. Planarization operations are well known in this field and are often achieved by chemical-mechanical polishing.

Figure 16:
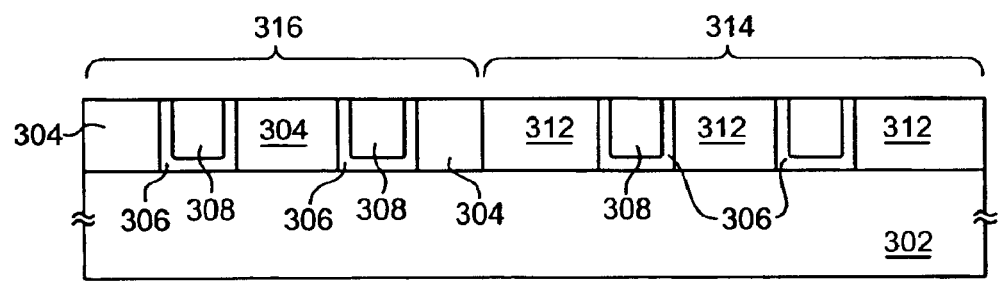
FIG. 16 is a schematic cross-section showing the structure of FIG. 15, after further operations mask the existing interconnect lines, and form additional interconnect lines by damascene processing in the area of the second dielectric.

A structure in accordance with the present invention is shown in schematic cross-section in FIG. 16. More particularly, FIG. 16 shows the structure of FIG. 15, after further operations mask existing Interconnect lines 308 in an area 316, and form additional interconnect lines by damascene processing in an area 314 of second intralayer dielectric 312. Various well-known photolithographic, etching, deposition, and polishing methods can be used to protect existing interconnect lines 308, etch trenches in second intralayer dielectric 312, deposit a conductive material and polish back that conductive material to form additional interconnect lines 308 in area 314.

Those skilled in the art and having the benefit of this disclosure will recognize that the process and structure described above in connection with FIGS. 13–16, can be rearranged such that intralayer dielectric 304 is a low-k dielectric, and that intralayer dielectric 312 is a high-k dielectric. In this case, interconnect lines 308 in region 314 would preferably be power lines, and interconnect lines 308 in region 316 would preferably be signal lines.

Similarly, those skilled in the art and having the benefit of this disclosure will recognize that the process and structure described above in connection with FIGS. 13–16, can be altered such that a hardmask layer is formed over first intralayer dielectric 304 and interconnect lines 308 prior to the fomnation of masking layer 310. Such a hardmask layer may be formed of a material such as, but not limited to, silicon nitride. This type of hardmask layer can provide protection of the underlying layers during processing operations.

Referring to FIGS. 17–21, a further alternative embodiment of the present Invention is described. In this embodiment, a first dielectric layer is formed on a substrate. A masking layer is then patterned to define an area of the first dielectric that is to be removed. This area is then etched, the masking layer is removed, and a second dielectric material is deposited and planarized. At this point, the substrate has a planarized dielectric layer wherein the dielectric layer has two different materials with different dielectric constants. A damascene process is then used to form interconnect lines.

Figure 17:
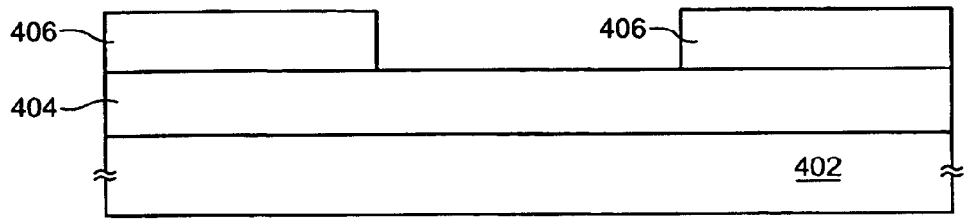
FIG. 17 is a schematic cross-section showing a patterned masking layer over a first dielectric material which itself is disposed over a substrate.

FIG. 17 is a schematic cross-section showing a patterned masking layer 406 over a first dielectric material 404, which, in turn, is disposed over a substrate 402. In the illustrative embodiment, substrate 402 is a wafer with various electrical components, interconnections, and insulating regions formed therein. First dielectric 406 is any suitable material with a dielectric constant greater than or equal to the dielectric constant of silicon dioxide. Barium strontium titanate (BST) is one example of a high-k material.

Figure 18:
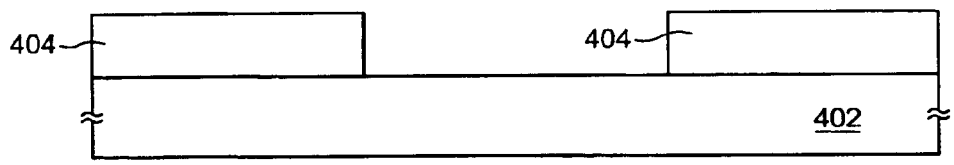
FIG. 18 is a schematic cross-section showing the structure of FIG. 17, after an exposed portion of the first dielectric material is removed, and the patterned masking layer is removed.

Referring to FIG. 18, it can be seen that both an exposed portion of first dielectric material 404, and patterned masking layer 406 have been removed. Well-known photolithographic and etching operations can be used to form the patterned dielectric structure shown in FIG. 18.

Figure 19:
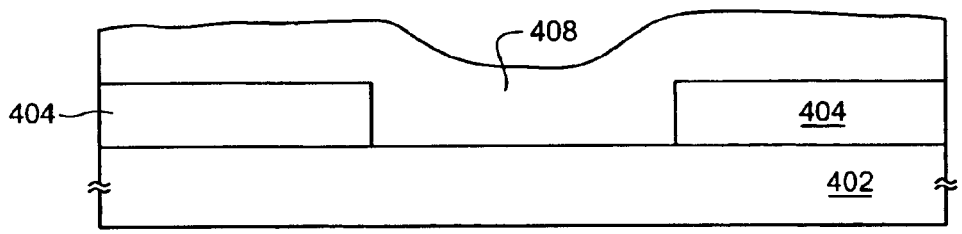
FIG. 19 is a schematic cross-section showing the structure of FIG. 18, after a second dielectric material is disposed over its surface.

As can be seen in FIG. 19, a second dielectric material 408 is disposed over the surface of substrate 402 and patterned dielectric layer 404. In this illustrative embodiment of the present Invention, second dielectric material 408 has a dielectric constant that Is different from that of first dielectric material 404.

Figure 20:
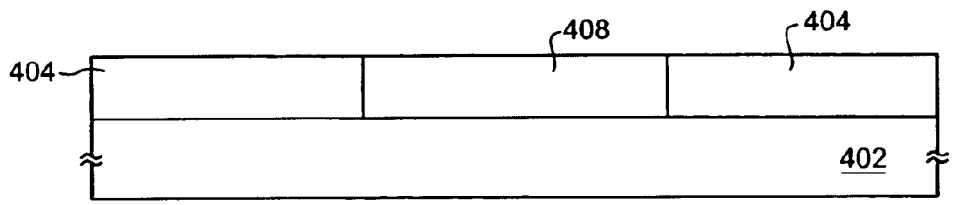
FIG. 20 is a schematic cross-section showing the structure of FIG. 19, after the second dielectric material is planarized.

FIG. 20 shows the structure of FIG. 19, after second dielectric material 408 is planarized. Various methods of planarization are well known in this field and the present invention is not restricted in any way to a particular planarization method. Typically, chemical-mechanical polishing is used to achieve a planarized surface. While planarization of the second dielectric material is preferred, those skilled in the art and having the benefit of this disclosure will recognize that depending on the thickness of the various dielectric layers and the degree of planarity with which they are formed, it may be possible to eliminate this particular planarization operation.

Figure 21:
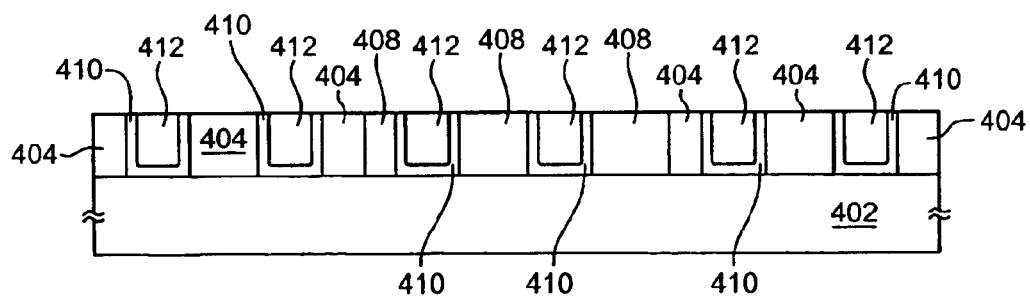
FIG. 21 is a schematic cross-section showing the structure of FIG. 20, after interconnect lines are formed by a damascene process in both the areas having the first dielectric material and the areas having the second dielectric material.

FIG. 21 is a schematic cross-section showing the structure of FIG. 20, after interconnect lines 412 are formed by a damascene process in both the areas having first dielectric 404 and the areas having second dielectric 408. In this illustrative embodiment, a liner 410 is disposed between interconnect lines 412 and intralayer dielectrics 404, 408. Liner 410 may be formed of a material such as, but not limited to, titanium nitride. Those skilled in the art will appreciate that a liner is sometimes used with interconnect lines so as to prevent undesirable interactions between the conductive material of the Interconnect lines and the dielectric material that otherwise surrounds the interconnect lines.

Several process flows have been described above, however each produces substantially the same structure. As can be seen by referring to the structures shown In FIGS. 6, 12, 16, and 21, a structure in accordance with the present invention includes conductive lines on a particular interconnect level wherein a first set of lines have a first dielectric material of a first dielectric constant disposed between them, and a second set of lines have a second dielectric material of a second dielectric constant disposed between them.

Typically, the power distribution interconnect lines have a high-k dielectric material therebetween, while the signal carrying interconnect lines have a low-k dielectric disposed therebetween. In this way, fine tuning of in-plane inter-line capacitance can be achieved. Structures embodying the present invention may provide increased decoupling between power distribution interconnect lines while simultaneously providing reduced parasitic capacitance between signal carrying interconnect lines.

CONCLUSION

Embodiments of the present invention provide low dielectric constant insulation between a first set of interconnects, and high dielectric constant insulation between a second set of interconnects on integrated circuits, where the first and second set of interconnects are on the same interconnect level.

An advantage of embodiments of the present Invention is that capacitance between signal interconnect lines Is reduced while capacitance between power supply nodes is increased. By selectively defining co-planar high-k and low-k intralayer dielectric regions, integrated circuit layout designs can reduce parasitic capacitance between signal lines while increasing the decoupling capacitance between nodes such as power and ground.

The present invention may be implemented with various changes and substitutions to the embodiments described and illustrated herein. For example, the present invention may be implemented without the need to etch away 10 portions of the first intralayer dielectric material. In such an embodiment a masking material would block the formation andlor placement of the first dielectric material between a first portion of the plurality of interconnect lines on the integrated circuit. After formation of the first intralayer dielectric, the masking material would be removed and the second intralayer dielectric formed.

Those skilled in the art and having the benefit of this disclosure will recognize that embodiments of the present Invention may have more than two varieties of Intralayer dielectric materials. That is, multiple regions may be created on an integrated circuit wherein intralayer dielectrics are tailored for specific circuit design goals. It will be understood that the present invention is not limited to a particular number of intralayer dielectric zones where the various zones have intralayer dielectric structures that provide different effective dielectric constants.

It will be readily understood by those skilled in the art that various other changes in the details, materials, and arrangements of the parts and steps which have been described and illustrated in order to explain the nature of this invention may be made without departing from the principles and scope of the invention as expressed in the subjoined Claims.

What is claimed is:

1. An apparatus comprising:

power supply interconnect lines;

a first dielectric material disposed between the power supply interconnect lines;

signal interconnect lines; and a second dielectric material disposed between the signal interconnect lines, wherein the first dielectric material has a greater dielectric constant than the second dielectric material, wherein the first dielectric material has a dielectric constant that is greater than or equal to a dielectric constant of silicon dioxide, and wherein the second dielectric material has a dielectric constant is less than the dielectric constant of silicon dioxide, and wherein the first and second dielectric materials are included in the same layer, and wherein the second dielectric material has a surface that is substantially co-planar with a surface of the first dielectric material.

2. The apparatus of claim 1, wherein the first dielectric material comprises barium strontium titanate, and wherein the second dielectric material comprises one or more selected from an organic polymer, a silicon based insulator containing an organic polymer, a nanofoam, and a fluorine doped oxide of silicon.

3. An apparatus comprising:

power supply interconnect lines;

a first dielectric material disposed between the power supply interconnect lines;

signal interconnect lines; and a second dielectric material, having a smaller dielectric constant than the first dielectric material, disposed between the signal interconnect lines and that is intralayer with the first dielectric material wherein upper surfaces of the first and second dielectric materials are substantially co-planar.

4. The apparatus of claim 3, further comprising a third dielectric material that is intralayer with the first and second dielectric materials and that has an upper surface that is substantially co-planar with the upper surfaces of the first and second dielectric materials.

5. The apparatus of claim 3, wherein the second dielectric material comprises an organic polymer.

6. The apparatus of claim 3, wherein the second dielectric material comprises a silicon based insulator containing an organic polymer.

7. The apparatus of claim 3, wherein the second dielectric material comprises a nanofoam.

8. The apparatus of claim 3, wherein the second dielectric material comprises a fluorine doped oxide of silicon.

9. The apparatus of claim 3, wherein the first dielectric material comprises barium strontium titanate.

10. The apparatus of claim 3, wherein the first dielectric material has a dielectric constant that is greater than a dielectric constant of silicon dioxide, and wherein the second dielectric material has a dielectric constant is less than the dielectric constant of silicon dioxide.

11. The apparatus of claim 10, wherein the first dielectric material comprises barium strontium titanate, and wherein the second dielectric material comprises one or more selected from an organic polymer, a silicon based insulator containing an organic polymer, a nanofoam, and a fluorine doped oxide of silicon.

12. The apparatus of claim 3, wherein a first power supply interconnect line is connected to a positive power supply node, and wherein a second power supply interconnect line is connected to a ground node.

13. An apparatus comprising:
a first and a second interconnect lines that are coupled to a first and a second power supply nodes, respectively;
a first dielectric material having a first dielectric constant disposed between the first and the second interconnect lines;
a third and a fourth interconnect lines that are coupled to a first and a second signal nodes, respectively; and
a second dielectric material having a second dielectric constant, which is less than the first dielectric constant, disposed between the third and the fourth interconnect lines, wherein the second dielectric material has a surface that is substantially co-planar with a surface of the first dielectric material.

14. The apparatus of claim 13, further comprising a third dielectric material that is intralayer with the first and second dielectric materials and that has a surface that is substantially co-planar with the surfaces of the first and second dielectric materials.

15. The apparatus of claim 13, wherein the second dielectric material comprises an organic polymer.

16. The apparatus of claim 13, wherein the second dielectric material comprises a silicon based insulator containing an organic polymer.

17. The apparatus of claim 13, wherein the second dielectric material comprises a nanofoam.

18. The apparatus of claim 13, wherein the second dielectric material comprises a fluorine doped oxide of silicon.

19. The apparatus of claim 13, wherein the first dielectric material comprises barium strontium titanate.

20. The apparatus of claim 13, wherein the first dielectric constant is greater than a dielectric constant of silicon dioxide, and wherein the second dielectric constant is less than the dielectric constant of silicon dioxide.

21. The apparatus of claim 20, wherein the first dielectric material comprises barium strontium titanate, and wherein the second dielectric material comprises one or more selected from an organic polymer, a silicon based insulator containing an organic polymer, a nanofoam, and a fluorine doped oxide of silicon.

22. The apparatus of claim 13, wherein the first power supply node comprises a positive power supply node, and wherein the second power supply node comprises a ground node.

23. An apparatus comprising:
a plurality of patterned, spaced apart, substantially co-planar, conductive lines;
a first dielectric having a first dielectric constant between a first portion of the plurality of conductive lines, wherein at least one of the first portion of the plurality of conductive lines is coupled to a first power supply node, and at least one of the first portion of the plurality of conductive lines is coupled to a second power supply node; and
a second dielectric that is intralayer with the first dielectric and that has a second dielectric constant, which is less than the first dielectric constant, between a second portion of the plurality of conductive lines, wherein at least one of the second portion of the plurality of conductive lines is coupled to a first signal node, and at least one of the second portion of the plurality of conductive lines is coupled to a second signal node, wherein the first and second dielectrics share a planarized surface.

24. The apparatus of claim 23, further comprising a third dielectric that shares the planarized surface with the first and second dielectrics.

25. The apparatus of claim 23, wherein the first dielectric constant is greater than a dielectric constant of silicon dioxide, and wherein the second dielectric constant is less than the dielectric constant of silicon dioxide.

* * * * *

UNITED STATES PATENT AND TRADEMARK OFFICE
CERTIFICATE OF CORRECTION

| | |
|---|---|
| PATENT NO. | : 6,949,831 B2 |
| APPLICATION NO. | : 10/890716 |
| DATED | : September 27, 2005 |
| INVENTOR(S) | : Chiang et al. |

It is certified that error appears in the above-identified patent and that said Letters Patent is hereby corrected as shown below:

In column 6, at line 3, delete "dietectric" and insert --dielectric--.

In column 6, at line 4, delete "han" and insert --than--.

Signed and Sealed this

Fourth Day of September, 2007

JON W. DUDAS
*Director of the United States Patent and Trademark Office*